United States Patent
Nagai

(10) Patent No.: US 6,552,379 B2
(45) Date of Patent: Apr. 22, 2003

(54) SEMICONDUCTOR DEVICE AND MANUFACTURING METHOD THEREOF

(75) Inventor: Yukihiro Nagai, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/121,602

(22) Filed: Apr. 15, 2002

(65) Prior Publication Data

US 2002/0195631 A1 Dec. 26, 2002

(30) Foreign Application Priority Data

Jun. 26, 2001 (JP) ........................................ 2001-192969

(51) Int. Cl.[7] ................... H01L 29/92; H01L 31/119
(52) U.S. Cl. .................... 257/296; 257/308; 257/310; 257/313; 257/900; 257/27.045; 257/27.087
(58) Field of Search ................................. 257/296, 308, 257/310, 532, 313, 906

(56) References Cited

U.S. PATENT DOCUMENTS

| | | | | |
|---|---|---|---|---|
| 5,780,930 A | * | 7/1998 | Malladi et al. | 257/532 |
| 5,786,259 A | * | 7/1998 | Kang | 257/306 |
| 5,923,062 A | * | 7/1999 | Ohno | 257/298 |
| 6,078,493 A | * | 6/2000 | Kang | 361/303 |
| 6,093,615 A | * | 7/2000 | Schuele et al. | 438/396 |
| 6,278,152 B1 | * | 8/2001 | Hieda et al. | 257/306 |
| 2002/0135010 A1 | * | 9/2002 | Sheu et al. | 257/306 |

FOREIGN PATENT DOCUMENTS

| | | | | |
|---|---|---|---|---|
| EP | 0 441 374 A1 | * | 7/1991 | H01L/29/92 |
| JP | 11-289058 | | 10/1999 | |
| JP | 2000-340767 | | 12/2000 | |

* cited by examiner

Primary Examiner—Jasmine J B Clark
(74) Attorney, Agent, or Firm—McDermott, Will & Emery

(57) ABSTRACT

A semiconductor device with capacitors which have a structure wherein fluctuation in thickness does not occur, even in the case that a dielectric film of low coverage is used. The semiconductor device is provided with adjoining first and second capacitors, wherein the respective capacitor is provided with lower electrode, dielectric film which contacts the top surface of the lower electrode and which has peripheral sidewall surfaces that continue to the peripheral sidewall surfaces of the lower electrode, first upper electrode that contacts the top surface of the dielectric film and a second upper electrode that contacts the top surface of the first upper electrode and the semiconductor device is further provided with a partition insulating film which covers the sidewall surfaces of lower electrode and the dielectric layer between the capacitors so that the second upper electrode contacts the top surface of the partition insulating film.

10 Claims, 5 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, in particular, to a semiconductor device having a capacitor which does not leak and a manufacturing method thereof.

2. Description of the Background Art

Conventionally, a film with a very good coverage, such as a silicon oxide film or a silicon nitride film made by means of a CVD (chemical vapor deposition) method, is used for the dielectric film of a capacitor. Therefore, a film of a uniform thickness can be formed even in the case that the lower electrode has a complex form. As for the structure of the complex lower electrode, a cylindrical structure, a thin structure, a structure where polysilicon is roughened, a trench structure, and the like, can be cited.

FIGS. 7 to 11 illustrate a process for a capacitor in a semiconductor device according to a prior art. First, a semiconductor substrate is provided below (see FIG. 11) and impurity regions formed in the semiconductor substrate and an insulating film 102, which covers a channel region, are formed. A contact plug 103 which contacts the above impurity regions is provided in the above insulating film 102. Next, a lower electrode layer 104 is formed so as to contact on the above contact plug 103 and insulating film 102 (FIG. 7). This lower electrode layer can be formed of a metal film, such as platinum. Next, the lower electrode layer is patterned by using a resist pattern, or the like, as a mask so as to form a storage node (lower electrode) 104a (FIG. 8).

Next, a dielectric film 105 is formed so as to cover the top surface and sidewalls of storage node 104a (FIG. 9). After this, a conductive film 106 for an upper electrode is formed so as to contact and cover the top surface and side surfaces of dielectric film 105 (FIG. 10). The semiconductor device shown in FIG. 11 is formed according to a capacitor process as described above. In FIG. 11, capacitor contact plug 103 makes a conductive connection between storage node 104a and an impurity region 114 in the semiconductor substrate.

In addition, a bit line contact 108 makes a conductive connection between a bit line 107 and an impurity region 113 provided in the semiconductor substrate. In addition, a transfer gate 109 usually used as a word line is formed of a gate insulating film 110 on a channel region (not shown) in the semiconductor substrate, a barrier metal layer 109b contacting and located above the gate insulating film and a metal layer 109a.

In recent years, new materials of a large dielectric constant, which allow a charge of a higher capacitance to be stored, have been developed as capacitor dielectric films. Therefore, application of these new materials to a semiconductor device has begun to be examined. As for these new materials, a BST ((Ba, Sr)TiO$_3$: barium strontium titanium oxide) film or an ST (SrTiO$_3$: strontium titanium oxide) film can be cited.

Though these materials have high dielectric constants and can implement a high capacitance, there is a problem wherein the coverage of the lower electrode is low. In particular, materials which cannot be formed by means of CVD and which can only be formed by means of spattering have very low coverage.

In the case that a material of low coverage is utilized, for example in the case that the lower electrode is in a plurality of convex forms separated from each other, the occurrence of a thin portion in the dielectric film at a corner portion, or the like, cannot be avoided. For example, in the case that a dielectric film with poor coverage or a dielectric film with a strong tendency to form crystals is formed as the capacitor dielectric film, a portion where the film is thin easily occurs in a portion of a corner of the storage node, such as portion B in FIG. 11. When the film is too thin in such a portion of the dielectric film, it becomes a place where a leak of the charge stored in the capacitor occurs. In addition, when a dielectric film of a uniform thickness is provided in order to prevent the leak, the capacitance of the capacitor is lowered.

SUMMARY OF THE INVENTION

Purposes of the present invention are to provide a semiconductor device with a capacitor having a structure wherein there are no places that leak even in the case that a dielectric film of low coverage is thinly formed as well as to provide a process for the same.

A semiconductor device of the present invention is a semiconductor device provided with first and second capacitors adjoining each other, the respective lower electrode of which is electrically connected to impurity region in a semiconductor substrate and the respective upper electrode of which is electrically connected to an external wire. In this semiconductor device the first and the second capacitors, respectively, has lower electrode which contacts the top surface of an insulating layer formed on the semiconductor substrate and the top surface of plug wire running through the insulating layer, dielectric film which contacts the top surface of the lower electrode and which has peripheral sidewall surfaces that continue to the peripheral sidewall surfaces of the lower electrode, first upper electrode, which contacts the top surface of the dielectric film, and a second upper electrode, which contacts the top surface of the first upper electrode. The semiconductor device is further provided with a partition insulating film which contacts the top surface of the insulating film and which covers the sidewalls of the lower electrode and the dielectric film between the first and the second capacitors, wherein the second upper electrode contacts on the top surface of the partition insulating film.

In this structure, a dielectric film for a basic capacitor structure is formed of only a dielectric layer in a plane arranged on the lower electrode layer in a plane. Therefore, a dielectric film of poor coverage film or a dielectric film which has a strong tendency to form crystals does not cover lower electrodes of a complex form, such as those having corner portions. Therefore, no portions of the film become so thin so as to cause a leak. In addition, the dielectric film of the first and second capacitors can be formed at the same level. Therefore, individual capacitor can be patterned in a deposition layer which is broader in a plane. Therefore, a factor causing a large fluctuation of the film thickness in one capacitor can be eliminated as a result of this portions of an individual capacitor where the dielectric film is extremely thin do not occur and, thereby, a leak can be prevented. A dielectric material of a high dielectric constant, of which the coverage is poor, can be used in order to form this dielectric layer of a sufficient thinness and, thereby, a semiconductor device provided with a capacitor of high capacitance can be gained.

In the above described semiconductor device of the present invention, the partition insulating film can cover an area ranging from the lower end of the sidewalls of the first upper electrode to a predetermined level.

In this structure, it becomes easy to provide the second upper electrode over a plurality of capacitors without causing a leak. Therefore, it becomes possible to easily connect a plurality of capacitors through the second upper electrode.

In the semiconductor device of the present invention the partition insulating film can be made of an insulating film filled in to the gap between the first and the second capacitors.

In this structure individual capacitors can be separated from each other so as not to cause a leak in the individual capacitors.

In the above described semiconductor device of the present invention, the second upper electrode can be provided in a continuous form over the first and the second capacitors that are separated by the partition insulating film.

In this structure the upper electrodes of the plurality of capacitors can be easily connected. Accordingly, the freedom of arrangement of an external wire which is electrically connected to the second upper electrode of the capacitors can be enhanced.

In the above described semiconductor device of the present invention, the first upper electrode can be tapered so that the width of the first upper electrode becomes narrower towards the top.

In this structure a gap narrower than the minimum width in a photomechanical process can be provided between adjoining capacitors by carrying out etching to create tapering. As a result of this, the areas of the dielectric films can be broadened to the maximum. Thus, it becomes possible to further increase the capacitance of the capacitors.

A method of manufacturing a semiconductor device of the present invention is a method of manufacturing a semiconductor device with a plurality of capacitors, the respective lower electrode of which is electrically connected to impurity region in a semiconductor substrate and the respective upper electrode of which is electrically connected to an external wire. This process is provided with the step of forming a lower electrode layer which contacts the top surface of an insulating layer formed on a semiconductor substrate and plug wire provided in the insulating layer, the step of forming a dielectric layer on the lower electrode layer, the step of forming a first upper electrode layer on the dielectric layer, the step of forming a plurality of basic capacitor structures made of lower electrodes, dielectric films and first upper electrodes by patterning the lower electrode layer, the dielectric layer and the first upper electrode layer, the step of forming an insulating layer which fills in the gaps between the plurality of basic capacitor structures and which covers the first upper electrodes and the step of removing the upper layer portion of the insulating layer so as to form partition insulating films which separate the plurality of basic capacitor structures and so as to expose the first upper electrodes.

In this structure, a broad dielectric layer is formed on a flat and broad lower electrode layer, on which a dielectric film of each of the basic capacitor structures is defined. Therefore, fluctuation in the film thickness of the dielectric films rarely occurs so that dielectric films of a uniform thickness can be gained. Furthermore, since capacitors are patterned from this flat and broad deposition layer, portions where the dielectric film is extremely thin can be prevented from being included in the capacitors. As a result of this, a semiconductor device with capacitors having minimal leakage can be gained. In addition, by using a dielectric material of a high dielectric constant, capacitors of a high capacitance can be gained.

In the method of manufacturing a semiconductor device of the present invention, the step of forming a second upper electrode layer that is positioned so as to contact the first upper electrodes can be provided after the step of exposing the first upper electrodes.

In this configuration, individual capacitors can be easily connected through the above second upper electrode layer. Therefore, freedom of arrangement of an external wire to which the second upper electrode layer of the capacitors is connected can be enhanced.

In the method of manufacturing a semiconductor device of the present invention, the step of flattening the lower electrode layer can be provided after the step of forming a lower electrode layer and before the step of forming a dielectric layer.

When the thickness of the dielectric film is made to be extremely thin, for example, in order to make the capacitance large, the surface coarseness of the lower electrode layer becomes a problem. In the case that the surface coarseness is great, a portion occurs where the dielectric film is locally thin and, in some cases, a leak occurs. In the above described structure, a smooth surface of the lower electrodes can be gained by carrying out a flattening treatment, such as a CMP treatment, on the lower electrode layer so that a portion wherein a local leak occurs is not created, even in the case that the dielectric film is made to be extremely thin. The flattening treatment can be carried out through CMP polishing, or the like.

In the method of manufacturing a semiconductor device of the present invention, the step of flattening of the insulating layer on which the lower electrode layer is formed before the step of forming the lower electrode layer.

In this structure the flatness of the insulating layer becomes excellent so that the lower electrode layer, of which the flatness is excellent, can be formed on the insulating layer. Therefore, it becomes possible to form a dielectric layer of a uniform film thickness without carrying out a particular flattening treatment on the lower electrode layer.

In the method of manufacturing a semiconductor device of the present invention, the first upper electrodes can be patterned so as to be in tapered forms wherein the widths of the first upper electrode is narrower toward the top in the step of patterning for forming the basic capacitor structure.

In this structure, gaps which are narrower than the minimum width in the photomechanical process can be provided between adjoining capacitors by carrying out the etching for creating tapering. As a result of this, since the areas of the dielectric films can be broadened to the maximum, it becomes possible to further increase the capacitance of the capacitors.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Next, the embodiments of the present invention are described in reference to the drawings.

Figure 1:
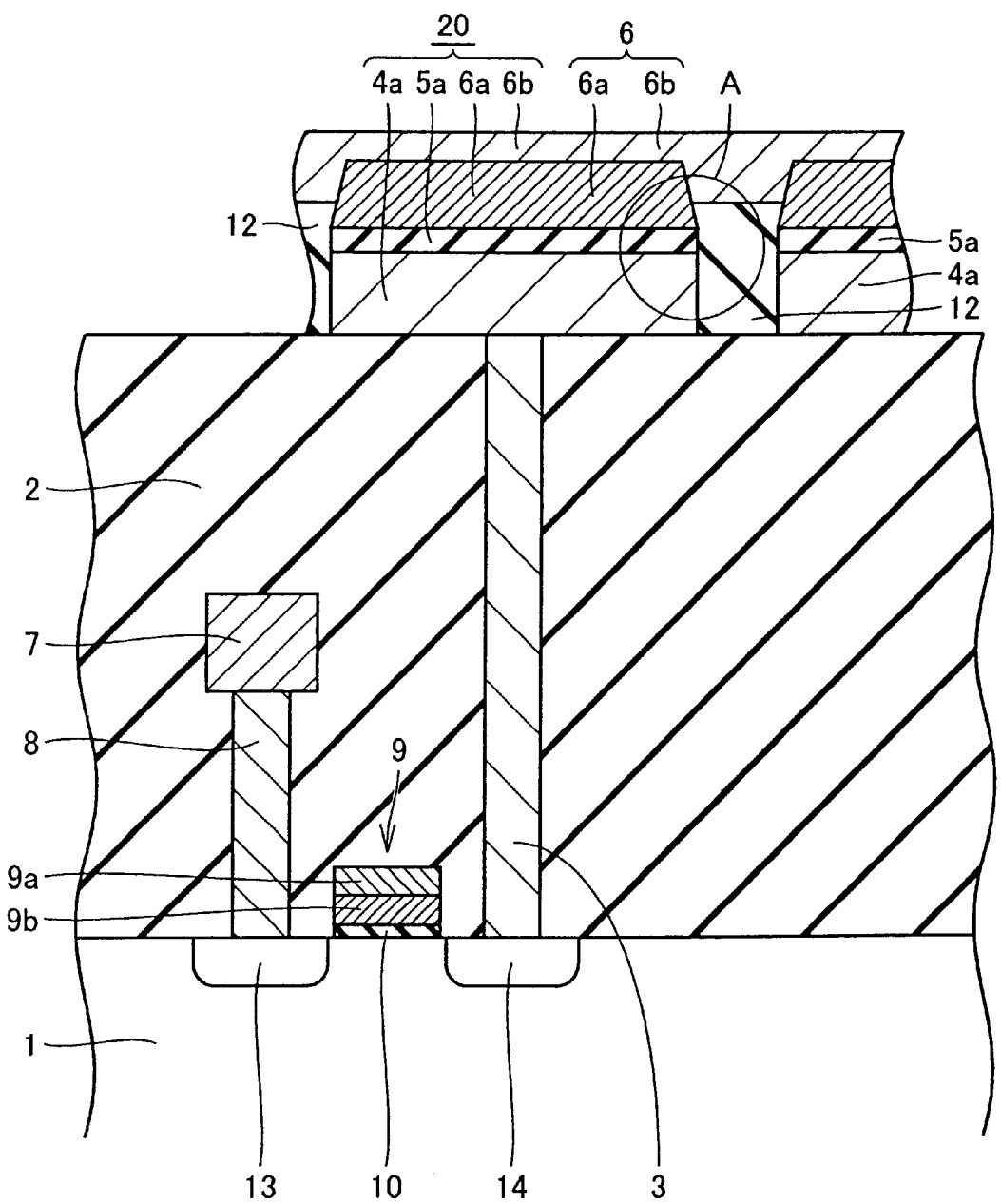
FIG. 1 is a schematic view of a semiconductor device with capacitors according to an embodiment of the present invention.

FIG. 1 is a schematic view of a semiconductor device according to an embodiment of the present invention. In the structure shown in FIG. 1, a plurality of capacitors 20 are aligned on an interlayer insulating film 2. Each capacitor 20 is provided with a lower electrode 4a connected to a capacitor plug wire 3, a dielectric film 5a on the lower electrode and a first upper electrode 6a on the dielectric film. Each capacitor 20 is isolated by partition insulating films 12. In addition, a continuous common upper electrode layer 6b is provided on, and contacts with, the top surfaces of first upper electrode 6a of each capacitor 20 and of each partition insulating film 12.

In addition, capacitor plug wire 3 is connected to an impurity region (source/drain) 14 in semiconductor substrate 1. A bit line 7 is also connected to a source/drain 13 in semiconductor substrate 1 through a bit line contact 8. A channel region (not shown) is arranged between source/drain 14, connected to the capacitor plug wire, and source/drain 13, connected to the bit line contact. A gate insulating film 10 is arranged so as to contact this channel region. In addition, a transfer gate 9, which is formed of a barrier metal 9b and a gate electrode 9a, is arranged on gate insulating film 10.

In the case that the above described transistor forms a memory cell, information is stored in the capacitor connected to a source/drain. In capacitor 20, shown in FIG. 1, a dielectric film 5a in a plate form contacts the top surface of the lower electrode in a plane and first upper electrode 6a contacts the top surface of the dielectric film. Therefore, the dielectric film does not cover a portion of a complex form, such as those having corner portions. As a result of this, a dielectric film of a uniform film thickness can be gained even in the case that a dielectric film of poor coverage or a dielectric film with a strong tendency to form crystals is formed.

In particular, even an edge portion, such as portion A in FIG. 1, where a leak conventionally occurs, does not form a corner portion so that portions with a risk of causing a leak can be eliminated. In addition, in the above described present embodiment, it is not necessary to make the film thickness over the entire dielectric film very great in order to prevent portions of extremely thin film from being created. As a result of this, a high capacitance can be gained without fail.

The above described capacitor parts in the semiconductor device can be manufactured according to the following steps. First, a conductive layer, which will become a lower electrode layer 4, is formed on interlayer insulating film 2 and on plug wires 2 provided in the interlayer insulating film. After this, a flattening treatment may be carried out in order to smooth the coarseness of the above lower electrode layer or the flattening process may be skipped so that the process progresses to the next step. In addition, it is desirable to carry out a flattening treatment on interlayer insulating film 2 formed in advance, after the formation of the interlayer insulating film.

Figure 2:
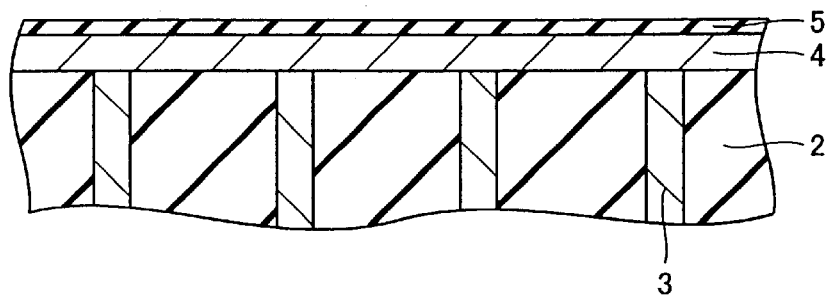
FIG. 2 is a cross section view at the stage where a dielectric layer is formed on a lower electrode layer at the time when capacitor parts of the semiconductor device of the present invention are manufactured.
Figure 3:
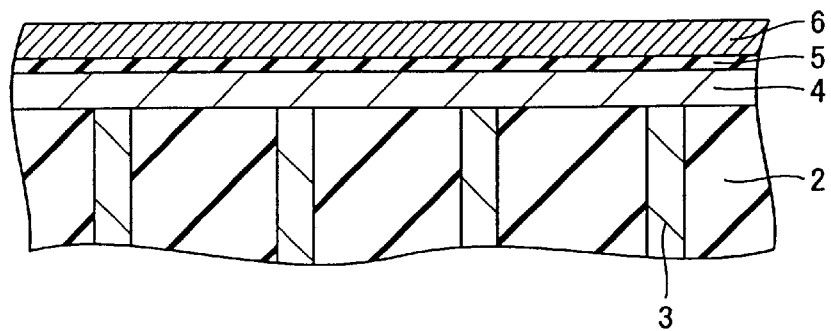
FIG. 3 is a cross section view at the stage where a first upper electrode layer is formed in addition to the condition in FIG. 2.
Figure 4:
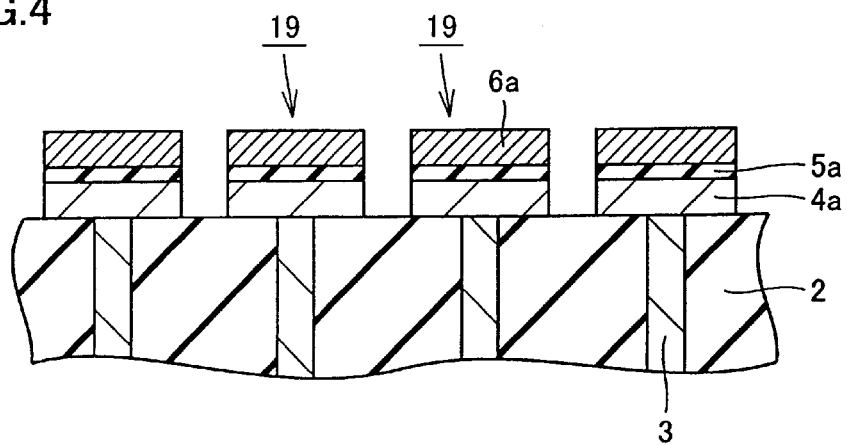
FIG. 4 is a cross section view at the stage where basic capacitor structures are formed by carrying out patterning treatment to the condition in FIG. 3.

Next, a dielectric layer 5 is formed on lower electrode layer 4 (FIG. 2). Furthermore, as shown in FIG. 3, a first upper electrode layer 6 is formed on dielectric layer 5. Next, first upper electrodes are formed by patterning the first upper electrode layer through etching using a photoresist pattern, or the like, as a mask. Furthermore, dielectric film 5a and lower electrode layer 4 are patterned by using the first upper electrodes as a mask. This patterning forms basic capacitor structures 19 made of lower electrodes 4a, dielectric films 5a and first upper electrodes 6a (FIG. 4). The above basic capacitor structures 19 are separated from each other by gaps.

Figure 5:
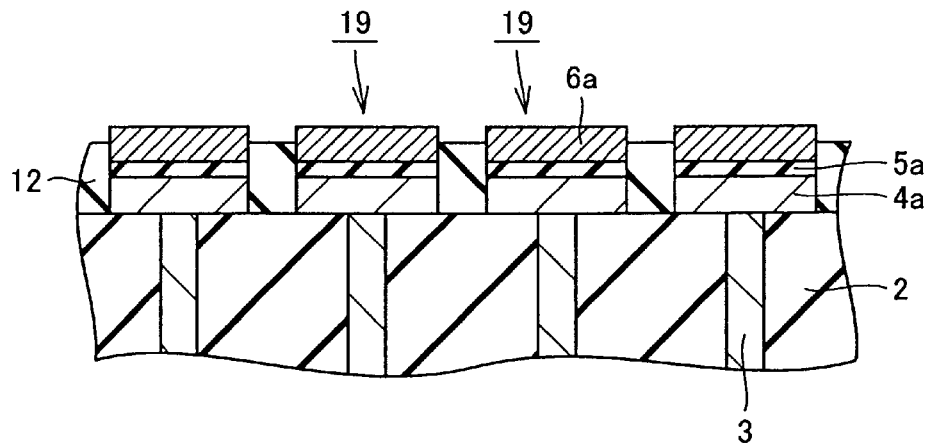
FIG. 5 is a cross section view at the stage where a partition insulating film is formed in addition to the condition in FIG. 4 and first electrodes are exposed by etching back or by carrying out a CMP treatment to the partition insulating film.
Figure 6:
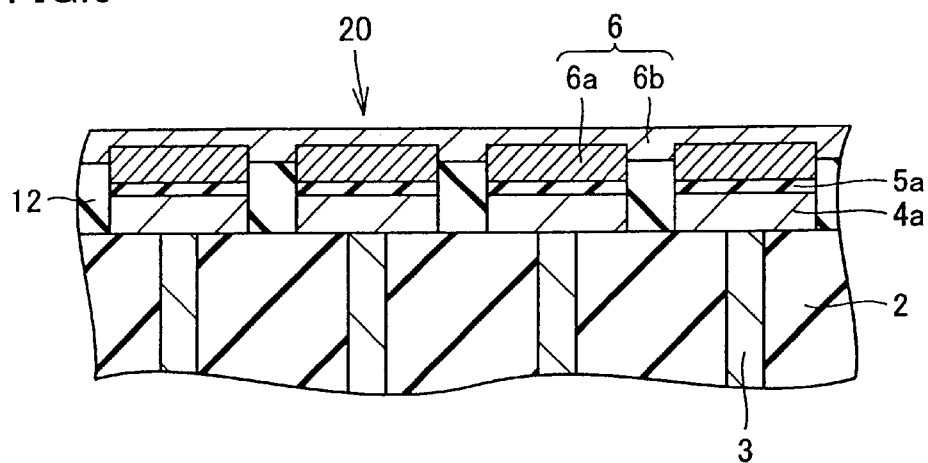
FIG. 6 is a cross section view at the stage where a second electrode layer is formed in addition to the condition in FIG. 5.
Figure 7:
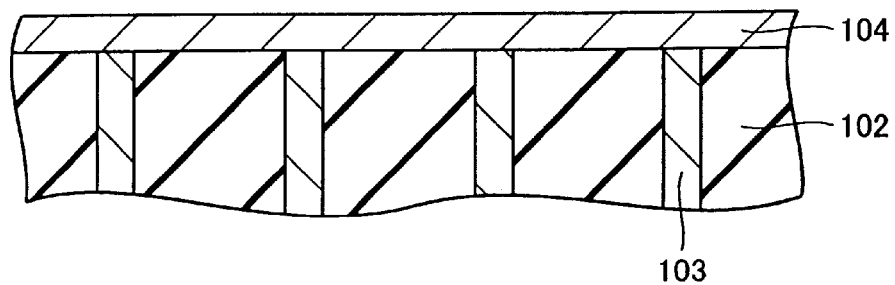
FIG. 7 is a cross section view at the stage where a lower electrode layer is formed on an interlayer insulating film at the time when capacitor parts of a semiconductor device according to a prior art are manufactured.
Figure 8:
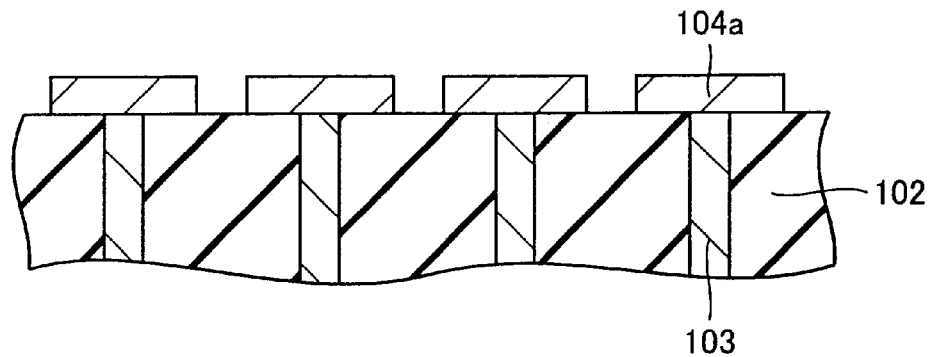
FIG. 8 is a cross section view at the stage where lower electrodes are formed by etching the lower electrode layer in the condition in FIG. 7.
Figure 9:
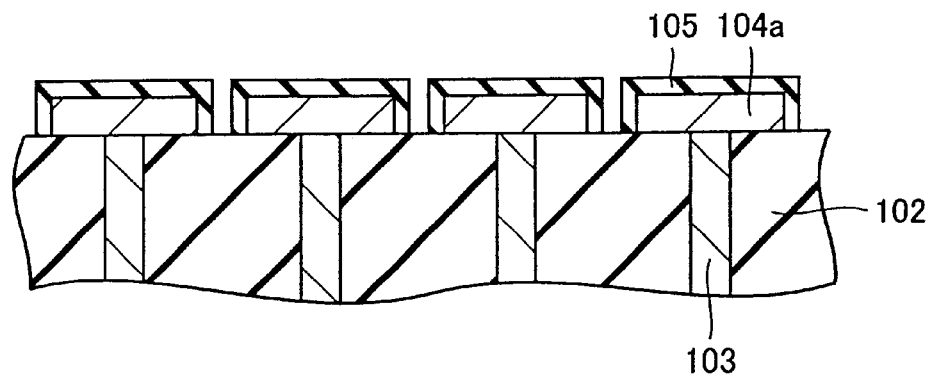
FIG. 9 is a cross section view at the stage where a dielectric film is patterned after being formed in addition to the condition in FIG. 8.
Figure 10:
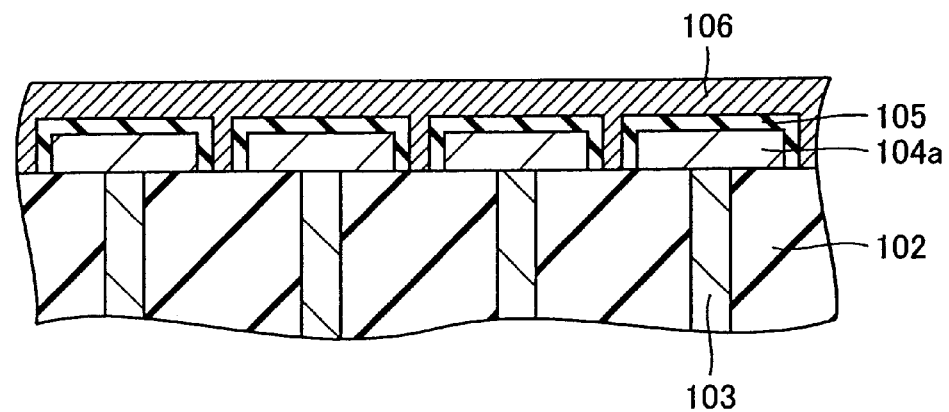
FIG. 10 is a cross section view at the stage where an upper electrode layer is formed in addition to the condition in FIG. 9.
Figure 11:
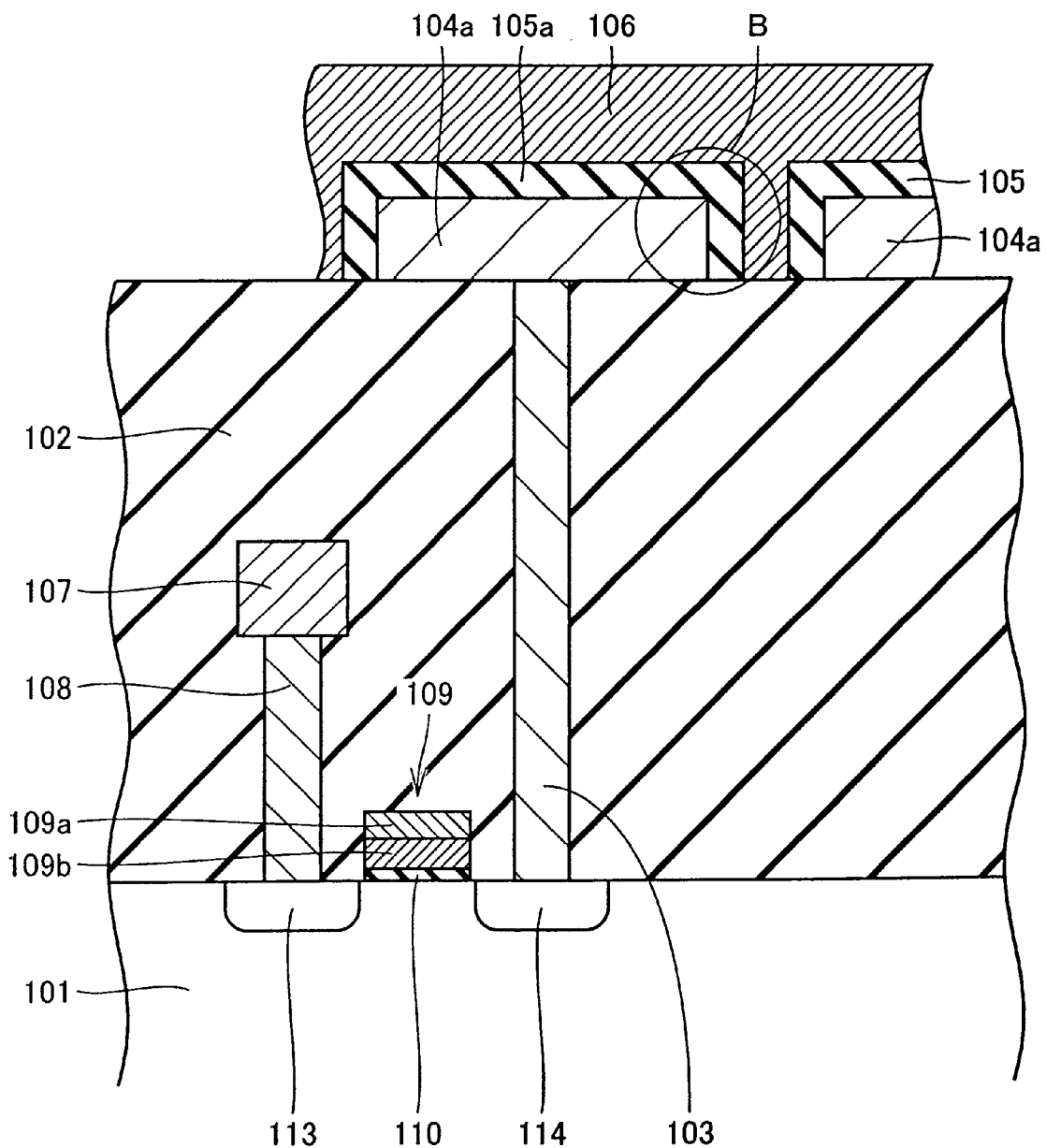
FIG. 11 is a schematic view of a semiconductor device with capacitors according to a prior art.

Next, a partition insulating film is formed so as to fill in the above gaps and so as to cover the first upper electrodes. Next, the first upper electrodes are exposed (FIG. 5) by etching back or by carrying out CMP (chemical mechanical polishing) on the above partition insulating film. Due to this etching back or CMP of the above partition insulating film, partition insulating film 12 becomes of a form which fills in the gaps between basic capacitor structures 19 leaving the upper portions recessed. A conductive layer for forming the second upper electrode layer is formed in addition to the condition in FIG. 5 (FIG. 6).

According to the above described process, basic capacitor structures are defined on a flat film of a large area whether it is a dielectric film of poor coverage or is a dielectric film with a strong tendency to form crystals. Therefore, a portion of the dielectric film which covers a corner portion, or the like, is not created. In addition, capacitors can be formed so as to be provided with flat films of a uniform thickness as dielectric films only. Accordingly, a new material of a high dielectric constant can be used irregardless of the poor coverage or the excellent coverage of the dielectric film and irregardless of the strong tendency or the weak tendency to form crystals. As a result of this, capacitors without a risk of leakage can be gained. In addition, capacitors of a high capacitance can be gained by using a material of a high dielectric constant for the dielectric film.

Though the embodiments of the present invention are described in the above, the embodiments of the present embodiment disclosed in the above are solely illustrative and the scope of the present invention is not limited to these embodiments of the invention. The scope of the present invention is defined by the description in the claims and further includes the meaning equivalent to the description of the claims and all of the modifications within the scope.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising first and second capacitors adjoining each other, the respective lower electrode of which is electrically connected to impurity region in a semiconductor substrate and, the respective upper electrode of which is electrically connected to an external wire, wherein said first and second capacitors, respectively, comprises:

lower electrode which contacts the top surface of an insulating layer, formed on said semiconductor substrate, and the top surface of plug wire passing through said insulating layer;

dielectric film which contacts the top surfaces of said lower electrode and which have peripheral sidewall surfaces which continue to the peripheral sidewall surfaces of the lower electrode; and first upper electrode which contacts the top surfaces of said dielectric film and a second upper electrode which contact the top surface of said first upper electrode, wherein said semiconductor device further comprises a partition insulating film between said first and said second capacitors which contacts the top surface of said insulating layer and which covers the sidewalls of said lower electrode and of said dielectric film, and wherein said second upper electrode contacts the top surface of said partition insulating film.

2. The semiconductor device according to claim 1, wherein said partition insulating film covers areas ranging from the lower ends of the sidewalls of said first upper electrode to a predetermined level.

3. The semiconductor device according to claim 1, wherein said partition insulating film is an insulating film which fills in a gap between said first and second capacitors.

4. The semiconductor device according to claim 1, wherein said second upper electrode is provided so as to continue over the first and second capacitors separated by said partition insulating film.

5. The semiconductor device according to claim 1, wherein said first upper electrode is tapered so that the width of the first upper electrode becomes narrower toward the top.

6. A method of manufacturing a semiconductor device with a plurality of capacitors, the respective lower electrode of which is electrically connected to impurity region in a semiconductor substrate and the respective upper electrode of which is electrically connected to an external wire, comprising:

the step of forming a lower electrode layer which contacts the top surface of an insulating layer formed on said semiconductor substrate and of plug wire provided in the insulating layer;

the step of forming a dielectric layer on said lower electrode layer;

the step of forming a first upper electrode layer on said dielectric layer;

the step of forming a plurality of basic capacitor structures made of lower electrodes, dielectric films and first upper electrodes by patterning said lower electrode layer, said dielectric layer and said first upper electrode layer;

the step of forming an insulating layer so as to fill in gaps between said plurality of basic capacitor structures and so as to cover said first upper electrodes; and the step of removing an upper layer portion of said insulating layer so as to form partition insulating films which isolate said plurality of basic capacitor structures and, at the same time, of exposing said first upper electrodes.

7. The method of manufacturing a semiconductor device according to claim 6, further comprising the step of forming a second upper electrode layer which is positioned so as to contact said first upper electrodes after the step of exposing said first upper electrodes.

8. The method of manufacturing a semiconductor device according to claim 6, further comprising the step of the flattening of said lower electrode layer after the step of forming said lower electrode layer and before the step of forming said dielectric layer.

9. The method of manufacturing a semiconductor device according to claim 6, further comprising the step of the flattening of said insulating layer on which the lower electrode layer is formed before the step of forming said lower electrode layer.

10. The method of manufacturing a semiconductor device according to claim 6, wherein said first upper electrodes are patterned to be in a tapered form so that the widths of the first upper electrode becomes narrower toward the top in the patterning step of forming said basic capacitor structure.

* * * * *